United States Patent [19]

Bauer et al.

[11] Patent Number: 4,566,186
[45] Date of Patent: Jan. 28, 1986

[54] MULTILAYER INTERCONNECT CIRCUITRY USING PHOTOIMAGEABLE DIELECTRIC

[75] Inventors: Charles E. Bauer, Cornelius; William A. Bold, Beaverton, both of Oreg.

[73] Assignee: Tektronix, Inc., Beaverton, Oreg.

[21] Appl. No.: 626,560

[22] Filed: Jun. 29, 1984

[51] Int. Cl.[4] .............................................. H01K 3/10
[52] U.S. Cl. ....................................... 29/852; 29/830; 427/97
[58] Field of Search ................ 29/852, 847, 848, 846, 29/830; 174/68.5; 427/97

[56] References Cited

U.S. PATENT DOCUMENTS

| | | | |
|---|---|---|---|
| 3,436,819 | 4/1969 | Lunine | 429/97 X |
| 3,835,531 | 9/1974 | Luttmer | 29/830 X |
| 3,922,479 | 11/1975 | Older et al. | 174/68.5 |
| 3,934,335 | 1/1976 | Nelson | 29/847 |
| 4,283,243 | 8/1981 | Andreades et al. | 427/97 X |
| 4,305,204 | 12/1981 | Toggart et al. | 29/841 |
| 4,360,570 | 11/1982 | Andreades et al. | 427/97 X |
| 4,469,777 | 9/1984 | O'Neil | 29/846 X |

OTHER PUBLICATIONS

IBM Tech. Discl. Bull. vol. 11, No. 8, Jan. 1969, p. 962, by Hermann.

*Primary Examiner*—Howard N. Goldberg
*Assistant Examiner*—Carl J. Arbes
*Attorney, Agent, or Firm*—John D. Winkelman; John Smith-Hill

[57] ABSTRACT

A method of fabricating multilayer printed circuit boards using polymer thick film technology is disclosed which utilizes photoimageable dielectric material between conductive polymer thick film layers and which is capable of producing extremely small and uniformly-sized vias.

15 Claims, 9 Drawing Figures

MULTILAYER INTERCONNECT CIRCUITRY USING PHOTOIMAGEABLE DIELECTRIC

This invention relates to the fabrication of multilayer printed circuit boards with interconnections between the layers.

BACKGROUND OF THE INVENTION

Multilayer printed circuit boards have been known for some time, but the art has developed a variety of problems. See, for example, U.S. Pat. Nos. 3,934,335 and 4,211,603 and the problems discussed therein which include delamination, layer misalignment, smearing of dielectric material onto circuitry layers and non-uniformly-sized and ill-defined vias, or holes through dielectric layers, for interconnection between layers of circuitry, as well as an inability to produce vias less than about 15 mils in diameter. There have been attempts to solve such problems, the attempts resulting in the development of some novel solutions, but the solutions themselves have often resulted in processes which are complex, time-consuming and relatively expensive. For example, in U.S. Pat. No. 3,934,335 there is disclosed a complex method of fabricating multilayer printed circuit boards involving forming conductive patterns by electrolessly plating a conductive metal onto a layer of dielectric which has first had its surface pitted by treatment with a caustic solution, then sensitized by treatment with successive solutions of tin and palladium salts. As another example, polymer thick film (PTF) technology is used for fabrication of a two conductive layer LED display device in U.S. Pat. No. 4,305,204, which discloses a time-consuming printing process for a double-printed dielectric layer over an etched conductor pattern, the dielectric comprising an epoxy resin and requiring a partial heat cure after the first printing and a full heat cure after the second printing; thereafter, a conductive PTF layer is silkscreened over the double-printed laminated dielectric layer and all three layers are further heat cured.

Thus, there exists a need for a multilayer printed circuit board fabrication process which is simple, fast, inexpensive and is capable of producing boards with sharply defined and uniformly sized vias substantially smaller than 15 mils in diameter and which will resist delamination and short circuiting under operating conditions. This need and other advantages are accomplished by the present invention, which is summarized and described in detail below.

SUMMARY OF THE INVENTION

According to the present invention, there is provided a method for fabricating multilayer printed circuit boards with points of interconnection between conductive layers and through intervening dielectric layers comprising a multi-step process as follows: (1) forming a conductive pattern on a non-conducting substrate such as epoxy by applying to the substrate a layer of conductive polymer thick film in a predetermined pattern and curing the film, (2) applying a layer of photoimageable photopolymerizable dielectric material over the cured conductive film, (3) forming a dielectric layer defining vias, or holes for interconnection of circuitry layers through the dielectric layer, by selectively exposing in a predetermined pattern the layer of photoimageable photopolymerizable dielectric material (4) forming vias through the layer of dielectric material by removing those portions of dielectric material corresponding to the desired vias and (5) forming a second conductor pattern on the dielectric layer and simultaneously forming conductive interconnections between the first and second conductor patterns and through the dielectric layer between the conductor patterns by applying a second conductive polymer thick film to the dielectric layer in a predetermined pattern whereby the vias or through holes are also coated on the insides thereof by the conductive polymer thick film, and curing said film. Should more than two conductive layers by desired, steps (2) through (5) may be repeated. The process of the present invention is also useful for forming multilayer printed circuit board with multiple layers on both sides of a substantially planar substrate by going through the same process outlined above, but forming the layers on both sides of the substrate.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
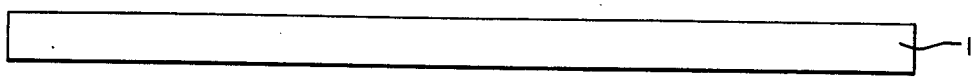
FIG. 1 is a cross-sectional view of an exemplary substantially planar non-conductive substrate.

Referring to the drawings, wherein like numerals indicate the same elements, FIG. 1 depicts an exemplary nonconducting substrate 1 which is typically a substantially planar monolithic configuration. Virtually any material that is nonconductive will suffice for the substrate, the only constraint being that it have sufficient tensile strength to support multiple layers and components and the ability to withstand the normal environment present under operating conditions of printed board circuitry. Preferred classes of substrate material include polymers, alumina, ceramics, paper and wood. Epoxy resin-impregnated glass cloth such as that known in the art as FR-4 is the most preferred class of substrate material.

Figure 2:
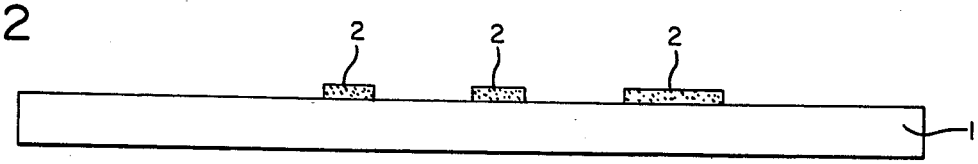
FIG. 2 is a cross-sectional view of the substrate of FIG. 1 showing a layer of conductive polymer thick film applied to one side thereof in an exemplary predetermined pattern.

The initial step in the fabrication process of the present invention comprises forming a conductor pattern on the substrate, illustrated in FIG. 2. The conductor pattern is formed by applying a conductive polymer thick film 2 to the substrate 1 in a predetermined pattern corresponding to a desired electrical circuit, the film being applied from about 0.2 mil to about 1.5 mils in thickness. In general, any metal dispersed in a polymer will do as long as it can conduct electricity adequately for good performance under normal operating conditions. An exemplary commercially available material is Amicon 932-62-1, an epoxy resin with silver dispersed therein and manufactured by Amicon Corporation of Lexington, Mass.

Application of the conductive polymer thick film may be made by silkscreening, printing, ink jet and pen plotter methods. Of these, silkscreening is preferred, using a silk screener with a stainless steel mesh of 80 to 400.

Curing the conductive polymer thick film 2 is accomplished by a convection oven, an infrared oven or a vapor cure. For example, using a convection oven and the conductive polymer thick film Amicon 932-62-1, cures should be in the range of 100° C. to 180° C. and from 20 to 60 minutes.

Figure 3:
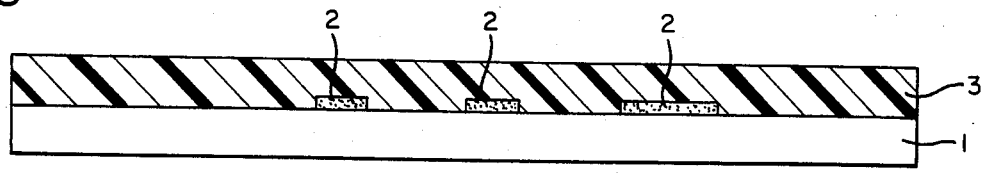
FIG. 3 is a cross-sectional view of the substrate of FIG. 1 showing a layer of photoimageable photopolymerizable dielectric material coated over the layer of conductive polymer thick film shown in FIG. 2.

The next step in the fabrication process comprises applying a layer of either "negative" acting or "positive" acting photoimageable photopolymerizable dielectric or insulator material over the polymer thick film conductor pattern. The application and development of "negative" acting material is best seen schematically in FIGS. 3-5. Referring to FIG. 3, the dielectric material 3 is laid down in contact with the conductor pattern 2 and the substrate 1 to be polymerized by a light source (not shown). If the material is "positive" acting, after application, exposure to a light source causes rupture of the polymeric bonds and reversion of the material to an essentially monomeric state. Of the two types of material, "negative" acting is preferred. Preferred classes of such material are epoxy resins and acrylic resins. An example of the "negative" acting photoimageable photopolymerizable dielectric material is Dynachem Laminar RM, an acrylicbased dry film soldermask made by Dynachem Corporation of Irvine, Calif.

The unexposed dielectric layer 3 is typically applied in a layer from about 0.1 to about 10 mils in thickness by silkscreening, printing, dip coating, spray coating, roller coating, curtain coating, dry film lamination and casting techniques, all well known in the art.

Figure 4:
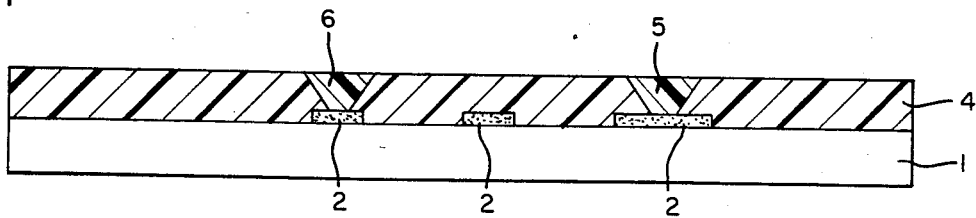
FIG. 4 is a cross-sectional view of the substrate of FIG. 1 showing the formulation of a dielectric layer defining vias by selective exposure of the layer of photoimageable photopolymerizable dielectric material.

Next, referring to FIG. 4, the unexposed dielectric layer 3 is selectively exposed to a light source (not shown) by masking it in a predetermined pattern corresponding to the desired location of holes through the dielectric for points of interconnection between a given conductive layer and the next succeeding conductive layer; such through holes are commonly referred to in the art as "vias" and the term is used here in that same sense. Upon exposure, the unmasked portions of, for example, "negative" acting dielectric are polymerized into a dielectric layer 4 which defines vias by surrounding unexposed (and so nonpolymerized) portions 5 and 6. Masking is accomplished by interposition of a stencil of some sort between the light source and the dielectric layer.

The polymerizing light may comprise virtually any wavelengths, but the most common and preferred are those in the ultraviolet range, which may be provided by commercially available circuit board exposure equipment such as that made by Colight, Inc. of Minneapolis, Minn.

Figure 5:
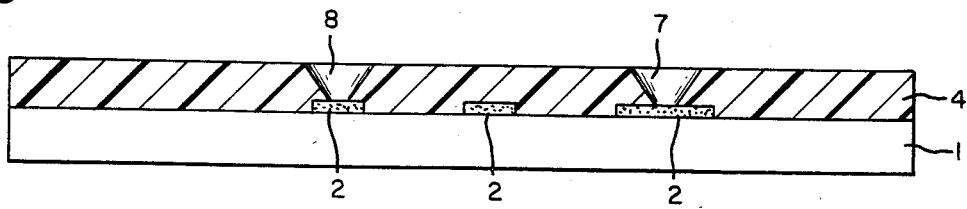
FIG. 5 is a cross-sectional view of the substrate of FIG. 1 showing exemplary vias created through the dielectric layer by removal of those portions of dielectric material corresponding to the vias.

Referring now to FIGS. 4 and 5, vias 7 and 8 are actually formed by removal of those portions of dielectric material 5 and 6 corresponding to the vias, shown in the drawings as removal of unexposed non-polymerized dielectric material. Removal is typically accomplished by contact with a solvent or plasma etching. By "solvent" is meant any liquid which is capable of forming a partial or complete solution with the unwanted dielectric material so as to effect removal thereof. For Dynachem Laminar RM, an appropriate solvent is a solution of 1% potassium carbonate.

In the event a "positive" acting photoimageable photopolymerizable dielectric material is selected, the material would be applied in a layer and masked so as to define vias, the exposure to a light source causing a photolytic reaction at the via sites, thus forming removable monomer at those sites. Upon removal of those monomeric portions corresponding to vias, the vias are formed.

After formulation of the dielectric layer 4, it may optionally be subjected to a heat cure to complete the cure, thereby enhancing its stability and adhesion to both the substrate 1 and to the first conductive polymer thick film 2. Curing temperatures and times will vary widely depending upon the particular dielectric material used. Either an infrared oven or a convection oven may be used; suitable curing temperatures and times for Dynachem Laminar RM in a convection oven are 140°–160° C. and 35–45 minutes.

Because of the much sharper definition produced by the photoimaging process, extremely small vias that are highly uniform in size with sharply defined boundaries are possible. For example, vias having diameters from 1 to 5 mils may be consistently produced with tolerances of ±0.1 mil. This advantage, coupled with finer line and space parameters for the conductor patterns, make possible the production of multilayer printed circuit boards of much higher density circuitry than is obtainable with conventional processes.

Figure 6:
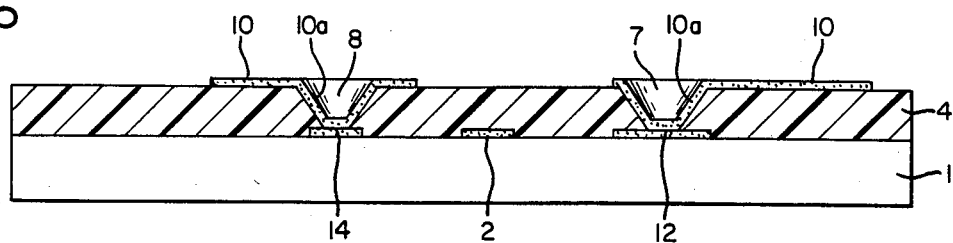
FIG. 6 is a cross-sectional view of the substrate of FIG. 1 showing application of an additional layer of conductive polymer thick film, the film coating the inside of the vias and making interconnections between conductive layers.

The final step in the creation of the simplest multilayer circuitry unit (comprising two circuitry layers separated by a dielectric layer with points of interconnection between the two circuits and through the dielectric) according to the present invention is the formation of another conductor pattern on the dielectric layer and the simultaneous formation of conductive interconnections between circuitry and through the dielectric, shown schematically in FIG. 6. This step is accomplished by applying in a predetermined pattern another conductive polymer thick film 10 in the same thickness range and by any of the same methods discussed above. Note that this step not only forms another conductor pattern but also coats vias 7 and 8 with conductive material schematically shown as 10a, thereby forming points of interconnection 12 and 14 between conductive layers 2 and 10.

Figure 7:
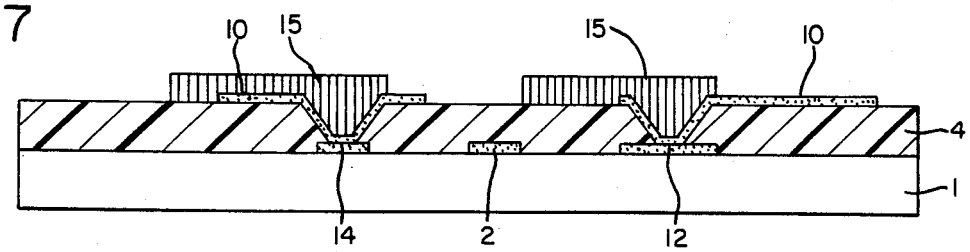
FIG. 7 is a cross-sectional view of the substrate of FIG. 1 showing application of a soldermask to the outermost conductive layer.

FIG. 7 shows the addition of a soldermask or covercoat 15 which is desireably added to the outermost conductor pattern 10.

To improve solderability, the outermost circuitry layer(s) and points of interconnection associated therewith are advantageously plated with nickel by electroless plating techniques well known in the art. The plating should be about 100 microinches thick, and as taught by Baudrand in "Advantages of Electroless Nickel Plating of Hybrid Circuits," 29 *Electronics* 20 (1983). Alternatively, the plating may be accomplished prior to addition of the soldermask in order to improve conductivity.

Figure 8:
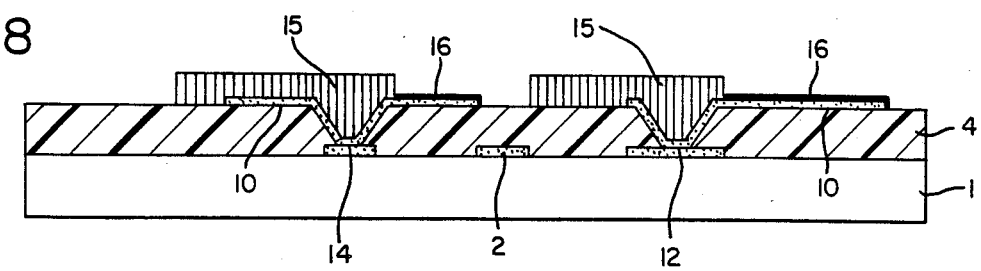
FIG. 8 is a cross-sectional view of the substrate of FIG. 1 showing deposition of electroless nickel plating over the outermost conductive layer.

FIG. 8 shows an exemplary layer 16 of electroless nickel plate on the outermost conductor pattern 10.

Figure 9:
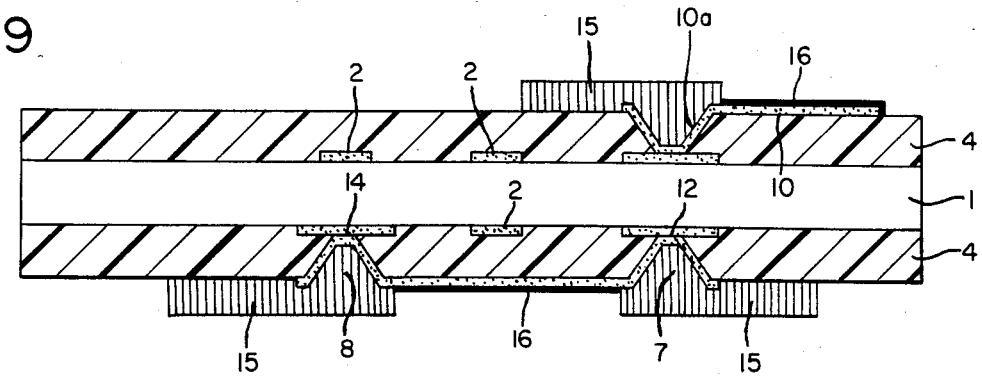
FIG. 9 is a cross-sectional view of the substrate of FIG. 1 showing the process of the present invention as applied to both sides of the substrate.

All of the above steps may of course be repeated in the same order to create multiples of the simplest multilayer circuitry unit up to a practical maximum of three to five per side of the substrate. Instead of building up layers on a single side of the substrate, a similar build-up may be accomplished by applying the process of the present invention to both sides of the substrate with the same process, FIG. 9 showing an exemplary cross-sectional view of the result of such a process.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A method of fabricating printed circuit boards having multiple predetermined conductor patterns, multiple dielectric layers between said conductor patterns and multiple predetermined points of interconnection between said conductor patterns and through said dielectric layers, the method comprising the steps of:
   (a) forming a conductor pattern on a non-conducting substrate by applying a conductive polymer thick film to said substrate in a predetermined pattern and curing said film;
   (b) applying a layer of photoimageable photopolymerizable dielectric material over said conductor pattern;
   (c) forming a dielectric layer defining vias by selectively exposing in a predetermined pattern said layer of photoimageable photopolymerizable dielectric material;
   (d) forming vias through said layer of dielectric material, by removing monomeric portions of dielectric material corresponding to said vias, said vias communicating with predetermined points of interconnection between conductor patterns;
   (e) forming another conductor pattern on said dielectric layer and simultaneously forming conductive interconnections between conductor patterns and through said dielectric layer between conductor patterns by applying another conductive polymer thick film to said dielectric layer in a predetermined pattern whereby said vias are also coated with said conductive polymer thick film, and curing said film; and
   (f) repeating steps (b) through (e) to form multiple electrically interconnected layers of circuitry separated by multiple layers of dielectric material.

2. A method of fabricating printed circuit boards having multiple predetermined conductor patterns, multiple dielectric layers between said conductor patterns and multiple predetermined points of interconnection between said conductor patterns and through said dielectric layers, the method comprising the steps of:
   (a) forming conductor patterns on both sides of a substantially planar non-conducting substrate by applying conductive polymer thick films to both sides of said substrate in predetermined patterns and curing said films;
   (b) applying layers of photoimageable photopolymerizable dielectric material over said conductor patterns;
   (c) forming dielectric layers defining vias by selectively exposing in predetermined patterns said layers of photopolymerizable dielectric material;
   (d) forming vias through said layers of dielectric material by removing monomeric portions of dielectric material corresponding to said vias, said vias communicating with said predetermined points of interconnection between conductor patterns;
   (e) forming two additional conductor patterns on said dielectric layers and simultaneously forming conductive interconnections between conductor patterns and through the dielectric layers between conductor patterns by applying two additional conductive polymer thick films to both sides of said dielectric layers in predetermined patterns whereby said vias are also coated with said conductive polymer thick film, and curing said film; and
   (f) repeating steps (b) through (e) to form multiple electrically interconnected layers of circuitry separated by multiple layers of dielectric material.

3. The method of claims 1 or 2 wherein said photoimageable photopolymerizeable dielectric material is selected from positive acting material and negative acting material.

4. The method of claims 1 or 2 wherein said photoimageable photopolymerizeable dielectric material is negative acting material and the removal of dielectric material of step (d) is accomplished by means selected from contact with a solvent and plasma etching.

5. The method of claims 1 or 2 further comprising applying a solder mask to the outermost conductor pattern(s).

6. The method of claims 1 or 2 further comprising electroless nickel plating of the outermost conductor pattern(s) and conductive interconnections associated therewith.

7. The method of claims 1 or 2 wherein the means of application of the conductive polymer thick film in steps (a) and (e) is selected from silk screening, printing, ink jet and pen plotter.

8. The method of claims 1 or 2 wherein the means of curing said film in steps (a) and (e) is selected from a convection oven, an infrared oven and a vapor cure.

9. The method of claims 1 or 2 wherein the means of applying a layer of photoimageable photopolymerizable dielectric material in step (b) is selected from silk screening, printing, dip coating, spray coating, roller coating, curtain coating, dry film lamination and casting.

10. The method of claims 1 or 2 wherein the substrate comprises an epoxy resin.

11. The method of claims 1 or 2 wherein the polymer thick film comprises a conductive metal dispersed in a polymer and is applied in a film about 0.5 to about 1 mil thick.

12. The method of claims 1 or 2 wherein the polymer thick film comprises silver dispersed in an epoxy resin and is applied in a film about 0.5 to about 1 mil thick.

13. The method of claims 1 or 2 additionally comprising heat curing said layer of photopolymerizable dielectric material between steps (d) and (e).

14. The method of claims 1 or 2 wherein said photoimageable photopolymerizable dielectric material is selected from epoxy resins and acrylic resins.

15. The method of claims 1 or 2 further comprising machining, drilling, routing, punching or cutting the completed circuit boards.

* * * * *